Aug. 10, 1965 G. L. CLAPPER 3,200,344

DYNAMIC COMPRESSION CIRCUIT WITH CONTROLLED CLIPPING

Filed Dec. 21, 1961 3 Sheets-Sheet 1

INVENTOR
GENUNG L. CLAPPER

BY G. R. Gugger
AGENT

Aug. 10, 1965 G. L. CLAPPER 3,200,344

DYNAMIC COMPRESSION CIRCUIT WITH CONTROLLED CLIPPING

Filed Dec. 21, 1961 3 Sheets-Sheet 2

Aug. 10, 1965 G. L. CLAPPER 3,200,344

DYNAMIC COMPRESSION CIRCUIT WITH CONTROLLED CLIPPING

Filed Dec. 21, 1961 3 Sheets-Sheet 3

United States Patent Office 3,200,344
Patented Aug. 10, 1965

3,200,344
DYNAMIC COMPRESSION CIRCUIT WITH CONTROLLED CLIPPING

Genung L. Clapper, Vestal, N.Y., assignor to International Business Machines Corporation, New York, N.Y., a corporation of New York
Filed Dec. 21, 1961, Ser. No. 161,088
2 Claims. (Cl. 330—24)

This invention relates to an amplifier circuit and more particularly to an amplifier having a fast acting compression circuit to adjust the output to a constant level in spite of variable input signal levels.

In the compression of speech and audio waveforms there are generally several requirements involved. One of these is that the compression attack be as fast as possible and there is not too much over-shoot and the other is that the response after compression be fast to enable the indication of the weaker speech sounds. Also, a definite level of overall sensitivity must be established to prevent noise amplification in periods of silence. This is often not done in regular public address equipment, the compression usually being a rather slow thing that tends to average out the volume and it is possible to have considerable delays both in the attack and recovery without serious problems. However, in speech analysis equipment there is needed both a fast attack and recovery and furthermore it is desired that no appreciable distortion be introduced since a frequency analysis is made upon the speech waveform and any clipping or other distortion would introduce frequencies which would upset any frequency analysis or speech recognition code that might be used. Former methods of compression have utilized a gain control operating upon the first or second stages of a pre-amplifier. Although this method is efficient, the operation is usually somewhat slow because of unavoidable delays produced by the relatively long time constants of the coupling networks.

In accordance with a preferred embodiment of the present invention, a method is provided for changing the total gain of an amplifier by operating on the output stage directly. An impedance changer circuit is applied as the load resistance for the last stage of the amplifier. A bilateral or symmetrical transistor is used for the active element, most alloy junction PNP transistors exhibiting this property to a degree sufficient for correct operation in this circuit. The circuit utilizes the bilateral properties of the transistor to operate on both positive and negative signals. Increased compression voltage results in increased conduction and lower impedance which lowers the gain of the last stage, so controlling the output amplitude without excessive distortion. Another feature is the provision of means to introduce compression or near clipping up to the point of clipping and controlling it to give a fast response.

In another embodiment of the present invention, instead of changing the impedance of the last stage the controlled clipping is utilized to change the operating point of the second stage of the amplifier. In both embodiments, the peaks of compression voltage will be immediately compressed and a succession of large signals will lower the gain of the whole amplifier in a comparatively short time.

Accordingly, a principal object of the present invention is to provide an improved amplifier having a fast acting compression circuit for adjusting the output to a constant level in spite of variable input signal levels.

A further object of the present invention is to provide an amplifier with dynamic compression and including a controlled or semi-clipping circuit, the output of which is integrated, amplified and fed back to control the gain of a stage of the amplifier.

A still further object of the present invention is to provide an improved amplifier with dynamic compression including means for controlling the gain of the amplifier by changing the impedance of the last stage.

The foregoing and other objects, features and advantages of the invention will be apparent from the following more particular description of preferred embodiments of the invention, as illustrated in the accompanying drawings.

Figure 1:
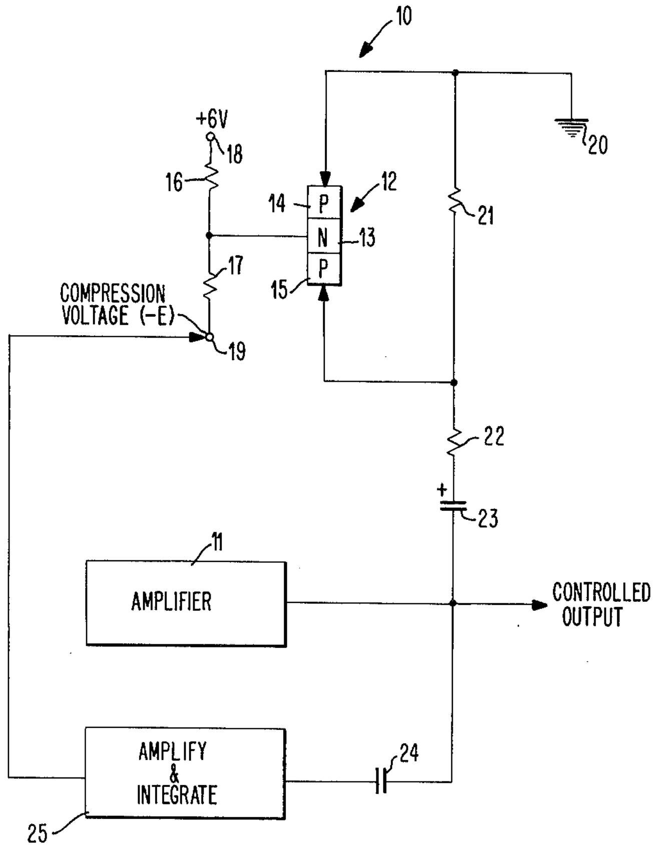
FIG. 1 is a schematic diagram of an impedance changer circuit for changing the total gain of an amplifier in accordance with a preferred embodiment of the present invention.
Figure 3:
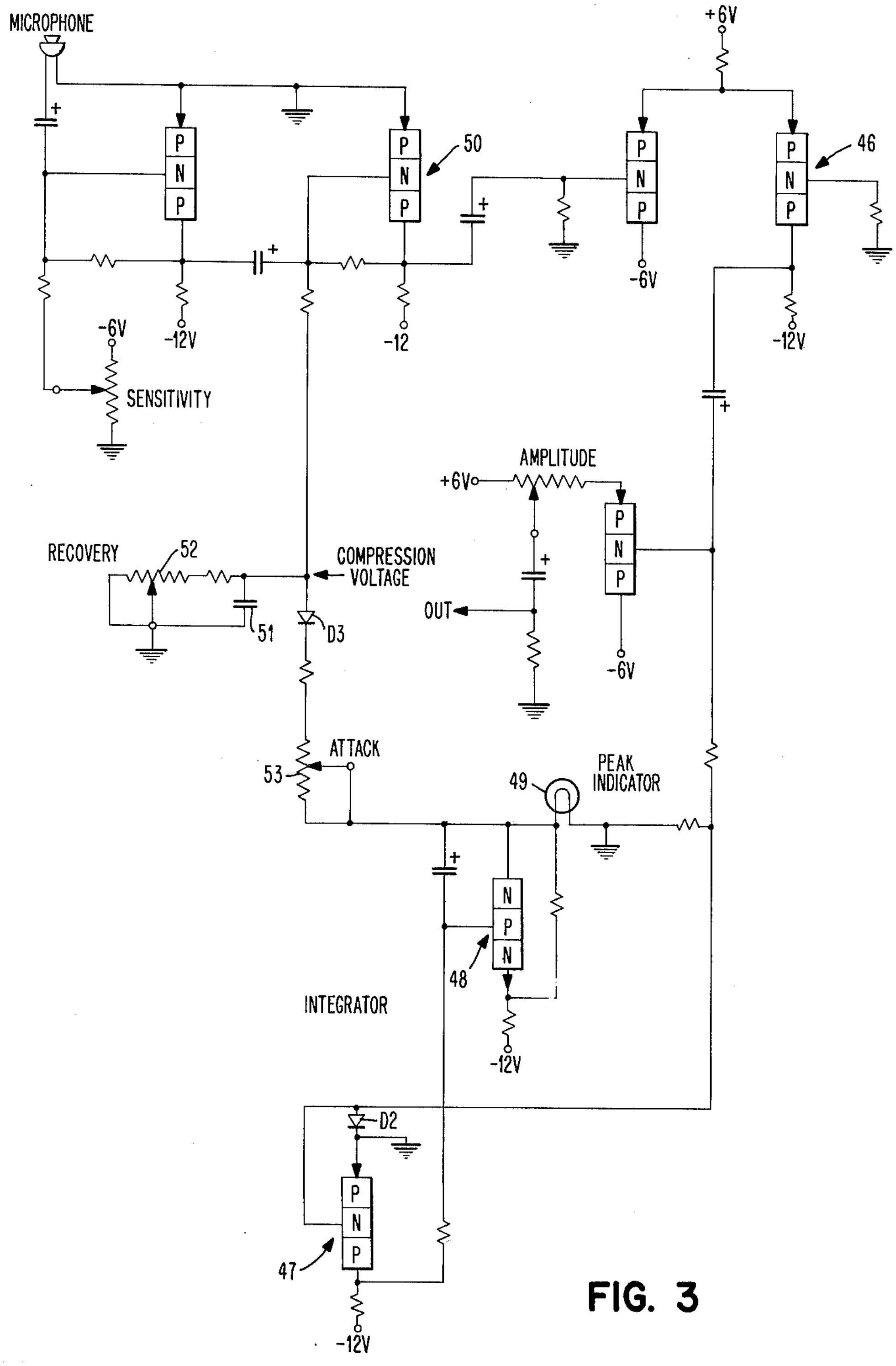

FIG. 3 is a diagram showing another embodiment of an amplifier circuit with dynamic compression Referring to FIG. 1, there is shown the general principle involved in the preferred embodiment of the present invention. An impedance changer circuit 10 is applied as the load resistance for the last stage of a current fed amplifier 11. A bilateral or symmetrical transistor 12, having a base electrode 13 and a pair of emitter electrodes 14 and 15, is shown as the active element. Most alloy junction PNP type transistors exhibit a symmetrical property to a degree sufficient for correct operation of the present circuit which utilizes the bilateral properties of the transistor to operate on both positive and negative signals. The base electrode 13 is connected to a voltage divider network which comprises the resistors 16 and 17 connected between a positive 6 volt terminal 18 and a terminal 19 to which the compression voltage of the circuit is applied.

The emitter electrode 14 is connected to a source of ground potential 20 and in parallel with the transistor is an impedance circuit for the amplifier stage 11 which comprises a pair of resistors 21 and 22 and a capacitor 23. The equivalent load impedance will vary as a function of the compression voltage which is applied at terminal 19. The capacitor 23 provides D.C. isolation for the output of the amplifier stage 11 and this stage is given a grounded base configuration so that the gain will be a function of the load impedance.

The A.C. output voltage from the amplifier stage 11 is fed through a capacitor 24 and suitable amplification and integration circuitry 25 to produce a D.C. compression voltage at terminal 19 that is proportional to the amplitude of the output of stage 11. The compression voltage varies the gain of the amplifier stage 11 by changing the conductance of the PNP transistor and thus the impedance which is reflected across the output impedance of the amplifier. For example, assume that resistor 21 has a value of 10K and resistor 22 a value of 100 ohms. With no compression voltage, the transistor 12 will be cut off and the impedance is about one megohm. The effective output impedance of the impedance changer is 10K. As the compression voltage builds up, the transistor conducts and the impedance drops. As a limit, the transistor impedance approaches a very low value so that the effective impedance of the circuit is 100 ohms. Increased compression voltage results in increased conduction and lower impedance which lowers the gain of the last stage 11, so controlling the output amplitude without excessive distortion.

Figure 2:
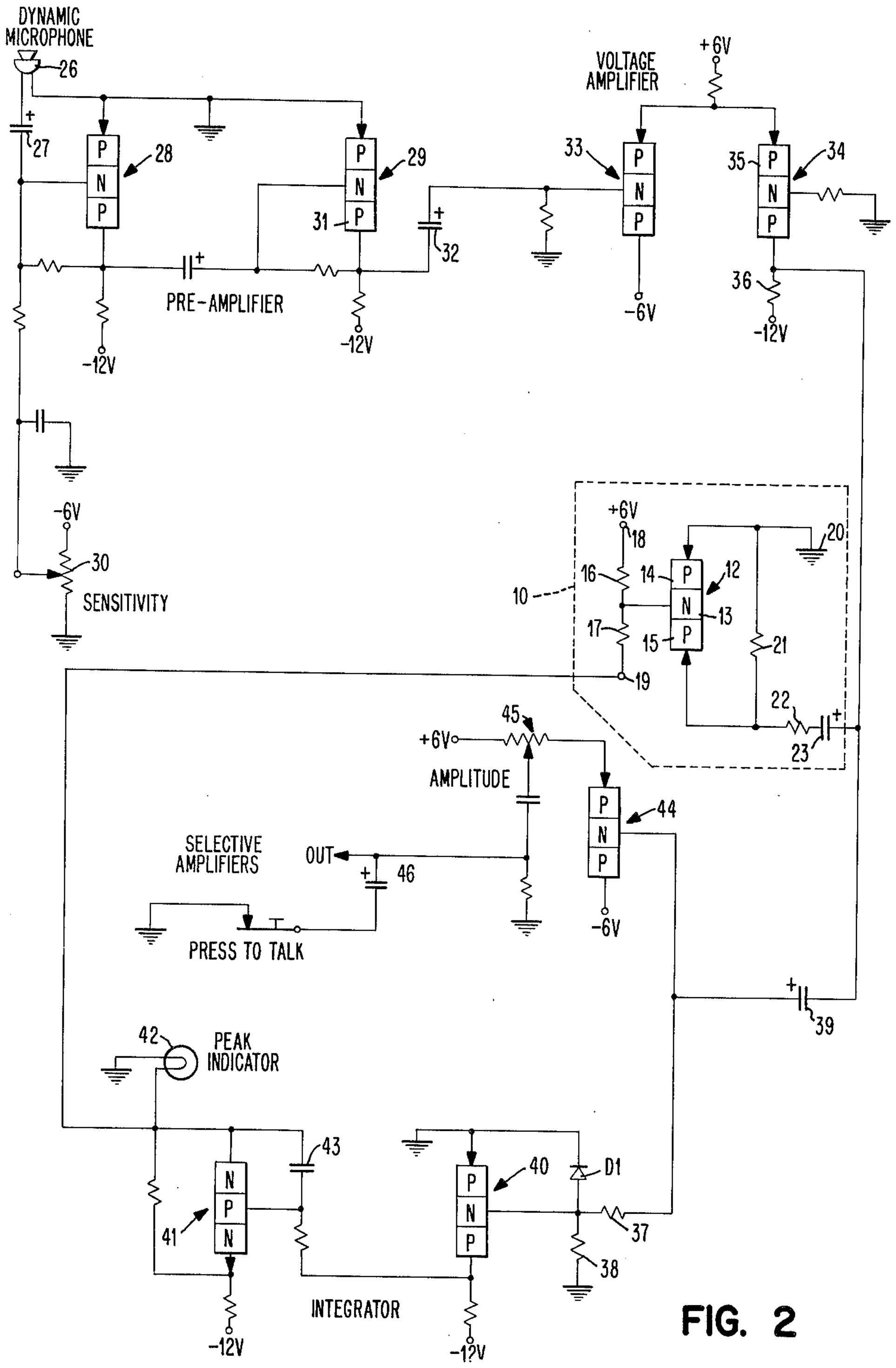
FIG. 2 is a diagram showing the impedance changer circuit of FIG. 1 applied to a particular amplifier circuit for compressing the output.

FIG. 2 shows how the above described circuit of FIG. 1 is incorporated into a speech amplifier with dynamic compression to speed up the compression action without introducing oscillations or distortion. A dynamic microphone 26 is shown feeding through an input capacitor 27 to a pre-amplifier circuit which comprises the two transistors 28 and 29. These stages are conventional capacitor-coupled grounded emitter stages operating in class A amplification with a high degree of degenerative feedback in each stage. Input sensitivity is controlled by changing the gain of transistor 28 through a change in its operating point by means of a manually controlled variable resistor 30.

A pre-amplifier output at the collector 31 of transistor 29 is reflected through a capacitor 32 to the base of a transistor 33. Transistor 33 along with a transistor 34 cooperate to form a novel voltage amplifier having inherent compression properties. Transistor 33 operates to control the current flowing in the emitter 35 of transistor 34 and transistor 34 operates as a grounded base voltage amplifier with constant current characteristics. Under these conditions, a change in the effective load impedance for transistor 34 changes the voltage gain of this stage. In parallel with the collector resistor 36 and the negative 12 volt terminal, transistor 34 sees an impedance determined by the values of resistors 37 and 38 connected in series to ground. The capacitor 39 provides the D.C. isolation for the output from the amplifier transistor 34. The resistor 38 is shunted by a diode D1 and the emitter-base diode of a transistor 40. Small signals produce very little current in these diodes so that their combined resistance is high. A high level positive going signal in the output of transistor 34 will cause current to flow in the diode D1 reducing the effective impedance for transistor 34 and, similarly, a large negative peak causes current to flow in the emitter-base diode of transistor 40 which lowers the effective impedance for transistor 34 and thus lowers the gain of this stage.

Since the transistor 40 forms part of the non-linear load resistance for amplifier stage 34, the need for increased compression voltage is immediately sensed as an increase in collector current which overcomes the bias of a transistor 41. Transistor 41 goes into conduction causing current to flow in a peak indicator incandescent lamp 42. Transistor 41 acts as an integrator because of the large capacitor 43 from collector to base, so that isolated peaks will not affect the compression voltage. The averaging effect is necessary to prevent undesirable feedback effects through the compression circuit.

The voltage across the incandescent lamp is used as the compression voltage and, in accordance with the preferred embodiment of the present invention, this compression voltage is fed back to the impedance changer circuit 10 which is applied as the load resistance for the last stage 34 of the amplifier. As was previously discussed in connection with FIG. 1, the compression voltage varies the amplifier gain by changing the conductance of the PNP transistor 12. Increased compression voltage results in increased conduction and lower impedance which lowers the gain of the last stage 34, so controlling the output amplitude without excessive distortion. The result is to speed up the compression action without introducing oscillations or distortion. Thus, a relatively constant signal appears at the base of a PNP transistor 44 which drives an amplitude potentiometer 45. Any desired signal amplitude may be selected to appear at the output terminal 46.

An interesting feature of the present circuit is the fact that the output from the last stage 34 of the amplifier is controlled in order eliminate any appreciable clipping or distortion which would introduce undesirable frequencies. To accomplish this, a tap is taken off of the output from stage 34 and some of the energy of the signal from the last stage is taken to a circuit which looks like a clipping circuit and which would be if it were not for feedback which will prevent clipping. Essentially the signal looks into the clipping circuit comprising the diode D1 and the emitter-base diode of transistor 40 and a part of the clip which is the energy derived in transistor 40 is integrated and amplified by transistor 41 to produce a voltage which is fed back to control the gain of the last stage of the amplifier. What happens is that if the signal comes in too strongly, it looks into the clipping circuit and starts to clip, but in doing so and if it starts to clip stronger, the voltage will be greater. A large voltage will be produced in the case of a tendency to clip strongly and it will be fed back to change the gain in the amplifier so that the net result is that the amplifier will always have a gain which will just produce enough of a signal to start the clip. Control at the start of the clip is important because a non-linear effect is desired whereby compression is obtained but without complete clipping or flat-topping which would introduce a bad output. The present circuit then has the advantage of not only controlling volume but also of introducing compression or near clipping up to the point of clipping and controlling it.

The circuit just described also operates with an exceptionally fast response. This is due to the fact that the output stage 34, which is producing the automatic gain control voltage, is the stage that is actually being controlled rather than controlling at some other point back in the amplifier. This creates a desirable condition of speed and a lack of tendency to oscillate. It might also be pointed out that whereas most automatic gain control systems are useful only at one frequency if they are speeded up for high speed operation, the present circuit will operate on a broad band which covers the audio range completely without any tendency to oscillate at any point in the system.

The circuit shown in FIG. 3 illustrates another form of amplifier having a compression circuit. It is similar to the circuit described in connection with FIG. 2 except that it does not employ an impedance changer to change the impedance of the last stage but instead the controlled clipping is utilized to change the operating point of the second stage of the amplifier. As shown in FIG. 3, the output is taken from the last stage 46 of the amplifier and again applied to a controlled clipping circuit comprising the transistor 47 and diode D2. The increase in collector current in transistor 47 overcomes the bias of the integrating transistor 48 to cause current to flow in the incandescent lamp 49. The voltage across the incandescent lamp is used as the compression voltage and in this embodiment it is utilized to change the operating point of transistor 50 and thereby vary the gain of the second stage. A diode D3 combines with a capacitor 51 to filter any roughness left by the integrator. Variable resistors 52 and 53 are used to control the charging and discharging times of the filter capacitor 51 thus allowing independent control of the compression "attack" and recovery.

Although the present circuits find great utility as a speech amplifier where dynamic compression is necessary without clipping or distortion, they may be also applied, for example, as magnetic drum timing tracks pre-amplifiers, magnetic tape pre-amplifiers, in public address systems and in satellite telemetering.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An amplifier circuit for compressing an audio frequency wave including in combination a pre-amplifier circuit comprising a pair of capacitor coupled grounded emitter transistors operating in class A amplification, a voltage amplifier circuit comprising first and second transistors each having base, emitter and collector electrodes, means for coupling the output from said preamplifier circuit to the base electrode of the first transistor of said voltage amplifier circuit, circuit means connecting the emitters of said first and second transistors of said voltage amplifier circuit together and to a voltage supply and connecting the collector of said first transistor to a voltage source whereby current flow in said first transistor operates to control current flow to the emitter of said second transistor and said second transistor operates as a grounded base voltage amplifier with constant current characteristics, means coupled to the collector output of said second transistor, said means including a transistor biased to conduction in response to predetermined variations in output of said amplifier to provide an output, circuit means for integrating and amplifying the output from said last-mentioned means to generate a compression voltage, impedance means connected between the collector of said second transistor and a reference potential operable in response to an applied signal to provide a varying impedance, a resistor connected from the collector of said second transistor to a reference potential, means for coupling said compression voltage to said impedance means whereby the load of said voltage amplifier circuit is determined and the gain of said amplifier controlled and bias means for said impedance means for controlling said impedance means to provide a nominal impedance in the collector circuit of said second transistor.

2. An amplifier circuit for compressing an audio frequency wave as in claim 1 wherein said impedance means comprises a transistor having a base electrode and a pair of emitter electrodes and an impedance connected in parallel with said transistor across said emitter electrodes wherein said impedance means is connected from the junction of an emitter and the resistor in the collector circuit of said second transistor and said compression voltage is applied to said base whereby variations in compression voltage control conductivity and the impedance of said collector circuit of said second transistor.

References Cited by the Examiner

UNITED STATES PATENTS

| | | | |
|---|---|---|---|
| 2,231,538 | 2/41 | Kreer | 333—16 |
| 3,019,396 | 1/62 | Heine et al. | 330—29 X |

FOREIGN PATENTS

| | | |
|---|---|---|
| 852,059 | 10/60 | Great Britain. |
| 340,866 | 10/59 | Switzerland. |

OTHER REFERENCES

Hamlin: "6-Transistor Amplifier-Modulator Delivers 10 Watts," Radio-Electronics, August 1957, pages 47–49.

ROY LAKE, *Primary Examiner.*

JOHN KOMINSKI, *Examiner.*